United States Patent
Babcock et al.

(10) Patent No.: US 10,172,250 B2
(45) Date of Patent: Jan. 1, 2019

(54) CABLE MANAGEMENT BRACKET

(71) Applicant: International Business Machines Corporation, Armonk, NY (US)

(72) Inventors: Raymond F. Babcock, Stewartville, MN (US); Matthew A. Butterbaugh, Rochester, MN (US); Eric A. Eckberg, Rochester, MN (US); Paul W. Schaefer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 15/834,253

(22) Filed: Dec. 7, 2017

(65) Prior Publication Data

US 2018/0263135 A1 Sep. 13, 2018

Related U.S. Application Data

(63) Continuation of application No. 15/454,076, filed on Mar. 9, 2017.

(51) Int. Cl.
| | |
|---|---|
| *H05K 7/14* | (2006.01) |
| *H05K 7/18* | (2006.01) |
| *F16M 13/02* | (2006.01) |
| *F16B 2/22* | (2006.01) |

(52) U.S. Cl.
CPC ............ *H05K 7/1401* (2013.01); *F16B 2/22* (2013.01); *F16M 13/02* (2013.01); *H05K 7/1491* (2013.01); *H05K 7/183* (2013.01)

(58) Field of Classification Search
CPC .... H05K 7/1401; H05K 7/1491; H05K 7/183; F16B 2/22; F16M 13/02
See application file for complete search history.

(56) References Cited

U.S. PATENT DOCUMENTS 2,620,251 A * 12/1952 Restivo .................. A47B 47/00
312/240
4,681,381 A * 7/1987 Sevey .................... A47B 88/43
312/333
(Continued)

FOREIGN PATENT DOCUMENTS

GB 2455990 A 7/2009

OTHER PUBLICATIONS

Babcock et al., "Cable Management Bracket," U.S. Appl. No. 15/454,076, filed Mar. 9 2017.
(Continued)

*Primary Examiner* — Nkeisha Smith
(74) *Attorney, Agent, or Firm* — James L. Olsen

(57) ABSTRACT

Embodiments of the present disclosure include a device for managing cables within a rack. The device may include a first planar surface and a second planar surface connected by a bend line, wherein the first and second planar surfaces form a cable bracket body. The cable bracket body may include a plurality of cable tie-down points. Further, the cable management device may include an attachment clamp which corresponds to respective mount points located on vertically aligned horizontal rails of a rack. The attachment clamp may be configured to securely attach the cable management bracket onto the mount points of vertically aligned horizontal rails.

10 Claims, 8 Drawing Sheets

(56) References Cited

U.S. PATENT DOCUMENTS

| | | | | |
|---|---|---|---|---|
| 6,373,707 B1* | 4/2002 | Hutchins | | G06F 1/183 |
| | | | | 211/41.17 |
| 6,378,966 B1* | 4/2002 | Baker | | G06F 1/181 |
| | | | | 211/26 |
| 6,442,030 B1* | 8/2002 | Mammoser | | G06F 1/1601 |
| | | | | 248/917 |
| 6,600,665 B2 | 7/2003 | Lauchner | | |
| 6,902,069 B2 | 6/2005 | Hartman et al. | | |
| 7,364,244 B2* | 4/2008 | Sandoval | | H05K 7/1411 |
| | | | | 312/333 |
| 7,472,970 B2* | 1/2009 | Bergesch | | G06F 1/181 |
| | | | | 211/26 |
| 7,604,308 B2* | 10/2009 | Tseng | | A47B 88/493 |
| | | | | 312/333 |
| 7,677,680 B1* | 3/2010 | Chang | | E05C 1/12 |
| | | | | 211/26 |
| 7,744,177 B2* | 6/2010 | Peng | | A47B 88/43 |
| | | | | 312/223.1 |
| 7,934,607 B2* | 5/2011 | Henderson | | H05K 7/1489 |
| | | | | 211/175 |
| 8,104,626 B2* | 1/2012 | Huang | | A47B 88/43 |
| | | | | 211/26 |
| 8,127,940 B2* | 3/2012 | Henderson | | H05K 7/1489 |
| | | | | 211/26 |
| 8,950,593 B2* | 2/2015 | Chen | | H05K 7/1489 |
| | | | | 211/26 |
| 9,004,432 B2* | 4/2015 | Lacarra | | A47B 88/43 |
| | | | | 211/26 |
| 9,326,414 B2* | 4/2016 | Eberle, Jr. | | H05K 7/1489 |
| 9,448,599 B2 | 9/2016 | Ehlen et al. | | |
| 9,474,336 B2* | 10/2016 | Fathi | | A44B 15/005 |
| 9,480,182 B2 | 10/2016 | Chen et al. | | |
| 2003/0160010 A1* | 8/2003 | Robertson | | G11B 33/127 |
| | | | | 211/26 |
| 2006/0011380 A1 | 1/2006 | Pierce | | |
| 2008/0143224 A1* | 6/2008 | Huang | | H05K 7/1489 |
| | | | | 312/333 |
| 2009/0114785 A1* | 5/2009 | Huang | | H05K 7/1489 |
| | | | | 248/220.31 |
| 2009/0174299 A1* | 7/2009 | Lam | | A47B 88/956 |
| | | | | 312/348.4 |
| 2009/0309471 A1* | 12/2009 | Yu | | H05K 7/1489 |
| | | | | 312/334.44 |
| 2010/0000257 A1* | 1/2010 | Sweeney | | A44C 5/0007 |
| | | | | 63/7 |
| 2011/0109213 A1* | 5/2011 | Wong | | G02B 6/4455 |
| | | | | 312/334.7 |
| 2011/0234072 A1* | 9/2011 | Hightower | | A47B 88/43 |
| | | | | 312/334.7 |
| 2012/0012714 A1 | 1/2012 | Rubenstein et al. | | |
| 2014/0068920 A1 | 3/2014 | Williams | | |
| 2014/0153186 A1* | 6/2014 | Liu | | G06F 1/189 |
| | | | | 361/679.58 |
| 2015/0048041 A1* | 2/2015 | Chuang | | H05K 7/1489 |
| | | | | 211/175 |
| 2015/0245709 A1* | 9/2015 | Iwamoto | | H05K 7/1489 |
| | | | | 211/175 |
| 2015/0257532 A1* | 9/2015 | Corbo | | A47B 47/027 |
| | | | | 211/26 |
| 2015/0313357 A1* | 11/2015 | David | | A47B 47/0083 |
| | | | | 211/187 |
| 2016/0029791 A1* | 2/2016 | Chen | | H05K 7/183 |
| | | | | 312/334.44 |
| 2016/0330859 A1 | 11/2016 | Chen et al. | | |
| 2017/0223857 A1* | 8/2017 | Jost | | H05K 7/12 |
| 2017/0223861 A1* | 8/2017 | Jost | | H05K 7/1427 |
| 2017/0223863 A1* | 8/2017 | Jost | | A47B 57/54 |

OTHER PUBLICATIONS

Babcock et al., "Cable Management Bracket," U.S. Appl. No. 15/693,018, filed Aug. 31, 2017.

List of IBM Patents or Patent Applications Treated as Related, Signed Dec. 7, 2017, 2 pages.

\* cited by examiner

CABLE MANAGEMENT BRACKET

BACKGROUND

The present disclosure relates generally to the field of electronics enclosures, and more particularly to rack cable management.

Enclosures, such as frames and racks, have been used to mount and store electrical components for many years. Enclosures typically include a chassis, which may be configured to mount brackets and shelves. The brackets and shelves may be configured to house electronic components, such as audio, video, and network devices or server computers. The electronic components housed in the enclosure may be connected to each other and to other components housed elsewhere via one or more cables that need to be routed throughout the enclosure and properly managed.

SUMMARY

Embodiments of the present disclosure include a device for managing cables within a rack and a method for attaching the device onto the rack. The device may include a first planar surface and a second planar surface connected by a bend line to form a cable bracket body. The cable bracket body may include a plurality of cable tie-down points. Further, the cable bracket body may include two or more attachment clamps which may be configured to attach to respective mount points located on vertically aligned horizontal rails.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
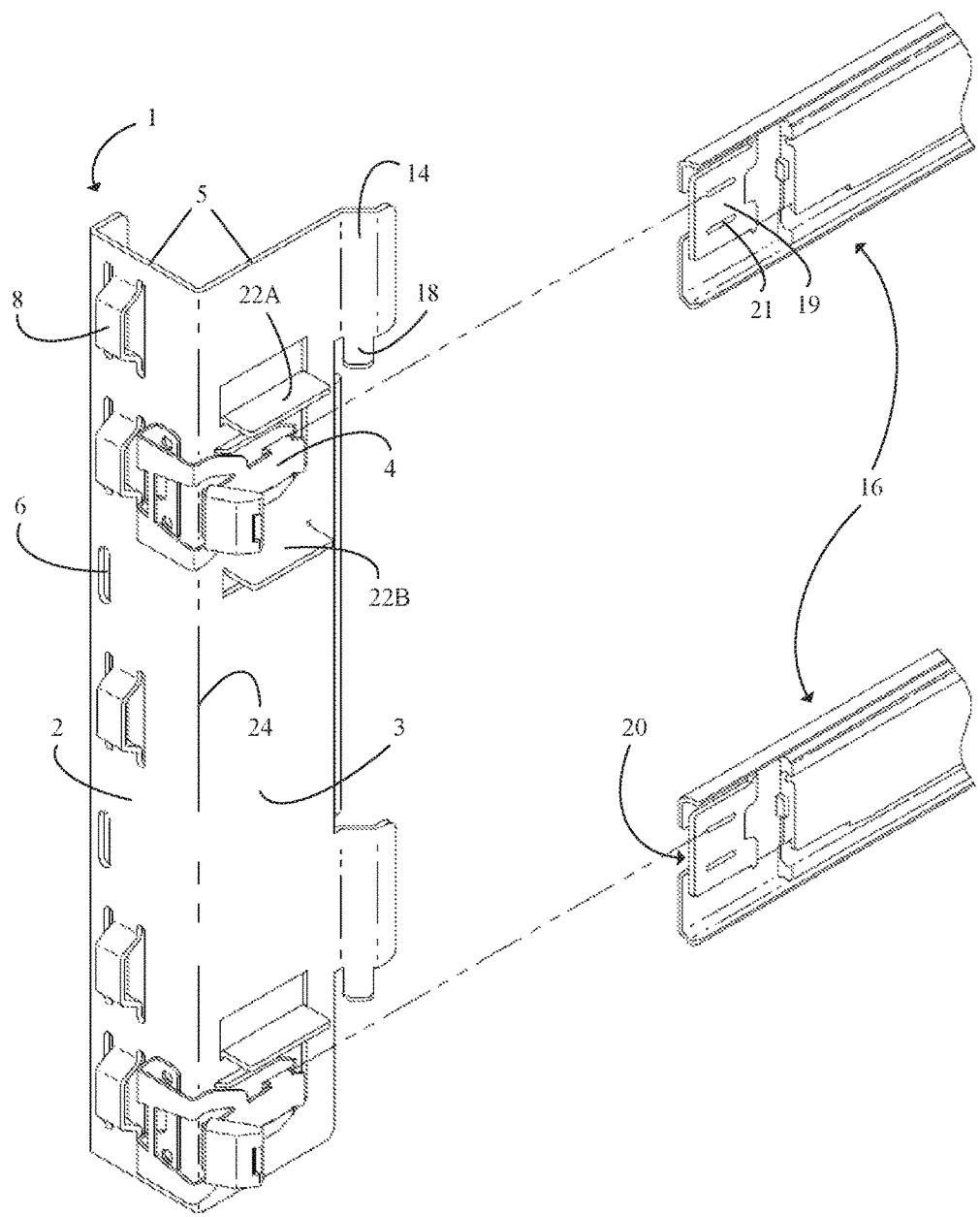
FIG. 1 illustrates a view of a cable management bracket separated from mount points located on vertically aligned horizontal rails, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electronics enclosures, and in particular to rack cable management. While the present disclosure is not necessarily limited to such applications, various aspects of the disclosure may be appreciated through a discussion of various examples using this context.

Current server cable management brackets for interconnecting a collection of servers (herein referred to as a POD) are typically affixed to a rear vertical rail mount of a rack. The POD, on the other hand, is typically mounted to the front vertical rail of the rack. Said cable management bracket may organize cables interconnecting servers within the POD. Further, the cable management bracket may be mounted on the vertical rail mount via hardware assembly (e.g., screws, bolts, rivets).

The aforementioned design may be problematic for a variety of reasons. First, because the cable management bracket is affixed to the rear vertical rail mount and the POD is affixed to the front vertical rail mount, if the relative distance between a front vertical rail mount and the rear vertical rail mount changes, so does the required cabling distance between individual servers in the collection of servers that comprise the POD. The relative distance between the front and rear vertical rail mounts may vary from rack to rack, as it is not standardized by the ELECTRONIC COMPONENTS INDUSTRY ASSOCIATION® (EVIA) (Electronic Components Industry Association non-profit corporation ILLINOIS 1111 Alderman Dr., Suite 400 Alpharetta Ga. 30005). At a constant cable length, if the distance between the back of the server POD and the rear vertical mounting rail increases, the amount of cable slack decreases, and vice versa. A decrease in cable slack may overstress cables, which may affect the longevity and performance of the cables. On the other hand, an increase in slack may lead to cables dangling into unintended spaces below the POD. Both scenarios may lead to cable management issues such as undesired bending of cables, overheating, obstructed airflow, or difficulty administering changes in the current rack design.

Further, mounting the cable management bracket to the rear vertical rail mount via hardware assembly may be an inconvenience to the user. For example, if the POD requires servicing, a technician may have to remove hardware assembly, or other attachments, from the bracket (e.g., unscrew the bolts or screws) to reach the serviceable components. This may additionally present difficulty administering changes to the rack configuration, as removing hardware assembly may be time-consuming.

Alternative approaches, such as Cable Management Arms (CMAs), attach to mounting features on the rear of the horizontal slides that mount each individual server in the rack. The distance between the mounting features on the rear of the horizontal slides and the back of the POD remains constant, as both the slides and the servers are affixed to the front vertical rail of the rack. Accordingly, this design bypasses offset distance cabling complications, as the distance remains fixed, ensuring the cable slack remains uniform.

However, because the CMA is horizontally positioned behind the POD, the back of the POD may be obstructed. This may obstruct airflow behind the servers. Further, this may prevent a technician from servicing the back of the POD without removing the CMA. These scenarios present additional operation costs for the owners.

The present disclosure relates to a cable management bracket for managing cables within a rack. The cable management bracket may include two or more cable tie-down points configured to mount attachments and projections onto the cable management bracket in order to properly manage cabling within the rack. The cable management bracket may include attachment clamps to facilitate attachment onto mount points located on the rear of horizontal rails.

Embodiments of the present disclosure may overcome the complications noted above regarding current cable management apparatuses. Attaching the cable management bracket to mount points on the horizontal rails ensures a uniform distance between the POD and the cable management bracket. Accordingly, the cable slack is also uniform regardless of the rack vendor. Further, utilizing an attachment clamp as opposed to hardware assembly or other attachment mechanisms (e.g., welding, soldering, riveting, adhesives) allows convenient attachment and detachment to the mount points. In the event that the cable management bracket needs removal, the attachment clamp may be conveniently retracted, allowing the cable management bracket to be dismounted from the rack. Additionally, because the bracket is vertically orientated, the back of the POD is fully exposed. This may reduce the frequency in which the bracket requires removal, as the back of the POD will be fully accessible for servicing. Lastly, this design may also prevent obstruction of airflow behind the servers.

Further, because cable slack may be uniform independent of the rack vendor, the cable management bracket may be pre-bundled with cables. In some embodiments, the cable management bracket may come equipped with personalized cable bundles (e.g., specific cable lengths and routing layouts). This may be completed prior to final assembly of the cable management bracket. This may allow the cable management bracket to be consistently compatible with server racks (e.g., as cabling routing/length may be consistent regardless of the rack vendor). Further, this may allow manufacturing the cable management bracket with corresponding cabling at a single manufacturing site.

It is to be understood that the aforementioned advantages are example advantages and should not be construed as limiting. Embodiments of the present disclosure can contain all, some, or none of the aforementioned advantages while remaining within the spirit and scope of the present disclosure.

FIG. 1 depicts a cable management bracket 1 separated from rail mount points 20 located on vertically aligned horizontal rails 16, in accordance with embodiments of the present disclosure. The cable management bracket 1 may include two main components, a cable bracket body 5, and attachment clamps 4. The cable bracket body 5 may be manufactured by bending a material (e.g., a piece of sheet metal) at an angle to form a bend line 24. The bend line 24 may define a first planar surface 2 and a second planar surface 3 on the cable bracket body 5. The cable bracket body 5 may contain a plurality of flush cable tie-down points 6 and protruding cable tie-down points 8. The flush and protruding cable tie-down points 6, 8 (herein collectively referred to as cable tie-down points) may be used to mount attachments and projections onto the cable management bracket 1 in order to properly manage cabling within a rack. The cable management bracket 1 may include one or more attachment clamps 4. The attachment clamps 4 may attach onto corresponding rail mount points 20 located on the vertically aligned (e.g., one horizontal rail 16 parallel to and placed above another horizontal rail 16, see FIG. 1) horizontal rails 16. The cable bracket body 5 may also include one or more guide tabs 22A, 22B. The guide tabs may include an upper guide tab 22A and a lower guide tab 22B (herein collectively referred to as guide tabs). Each guide tab may correspond to an attachment clamp 4. Guide tabs may guide the horizontal rail 16 into position with the cable management bracket 1 to align attachment clamp 4 with the rail mount points 20. The cable management device 1 may further include a protruding tab 14 and a contact protuberance 18, to provide rough alignment between the guide tabs and the horizontal rails 16.

Figure 3:
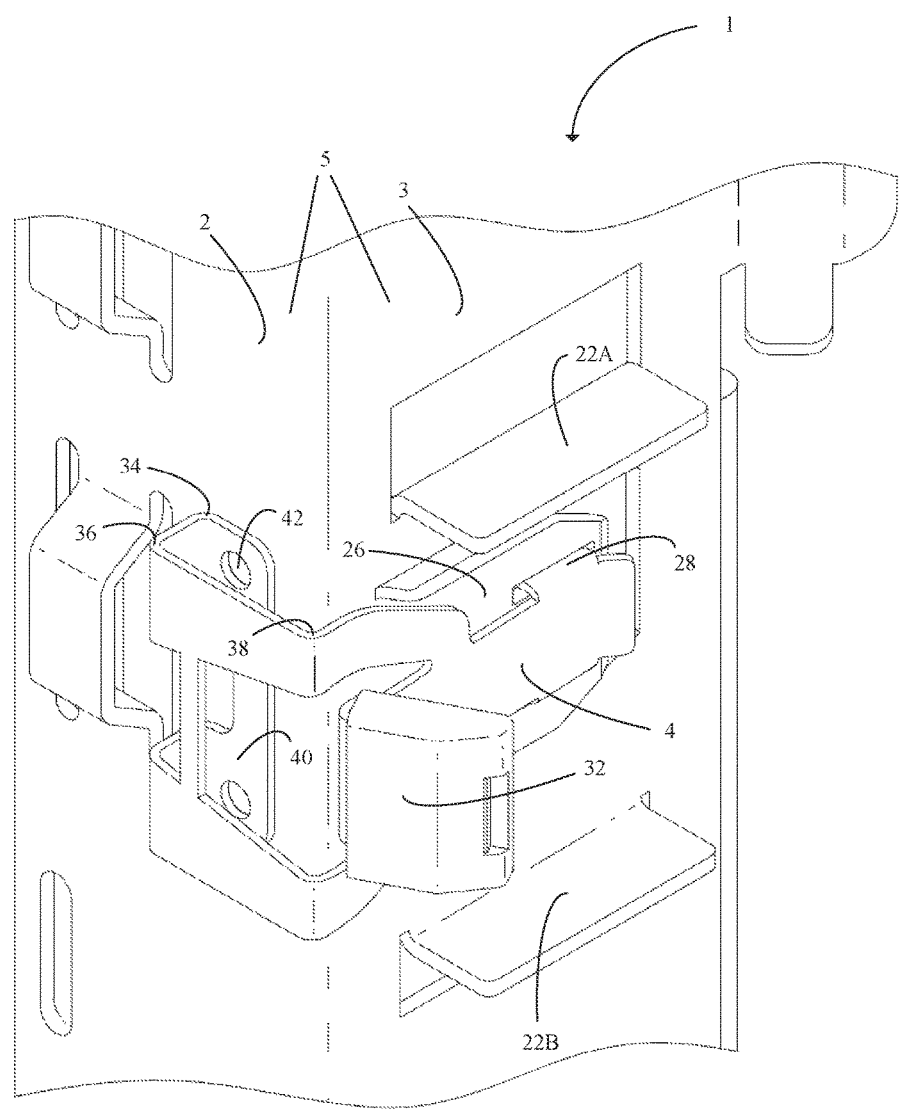
FIG. 3 depicts a zoomed-in view of an attachment clamp of the cable management bracket, in accordance with embodiments of the present disclosure.

The cable management bracket 1 may be attached onto mount points 20 located on the horizontal rails 16 by following the dashed projection lines (e.g., the dashed lines connecting the attachment clamps 4 to the mount points 20) depicted in FIG. 1. The mount points 20 may include mount plates 19 and mount slots 21. Features on the attachment clamps 4 (e.g., clamp teeth 28 as shown in FIG. 3/4) may be configured to attach to mount slots 21 located on the mount points 20.

Forming bend line 24 on the cable bracket body 5 may be done by bending a material at an angle. The material of the cable bracket body 5 may be bent at any suitable angle, and may depend on the environment in which the cable management bracket 1 will be administered. In some embodiments, the material of the cable bracket body 5 may be bent at an angle of substantially 90° (e.g., between 85-95°). In some embodiments, the material of the cable bracket body 5 may be bent at an obtuse or acute angle. The angle may be selected depending on the functionality of other features on the cable management bracket. For example, bending the material of the cable bracket body 5 at a substantially 90° angle may configure flush cable tie-down points 6 to be flush with surrounding rack hardware so that the cable management bracket 1 may be attached to corresponding rack hardware. In some embodiments, the material of the cable bracket body 5 may be bent at an obtuse angle (e.g., between 110° and 130°), shortening the distance between the protruding cable tie-down points 8 and the back of the servers. This may increase cable slack, which may decrease undesired bending of cables. In some embodiments, the cable bracket body 5 may be bent at an acute angle (e.g., between 50° and 70°), increasing the distance between the protruding cable tie-down points 8 and the back of the servers. This may reduce cable slack, which may prevent cables from dangling into unintended spaces below the servers.

Flush cable tie-down points 6 may allow attaching projections and attachments (e.g., fasteners, such as screws or bolts) onto the cable management bracket 1 in order to properly manage cables within the rack. Further, the flush cable tie-down points 6 may be used to mount the cable management bracket 1 onto other hardware (e.g., a bracket, rail, or panel) of rack. The size and shape of the flush cable tie-down points 6 may be altered depending on the selected projection or attachment. For example, the shape of the flush cable-tie down points 6 may be substantially circular when using circular projections such as screws, bolts, nails, stakes, poles, rivets, wires, ropes, or any other substantially circular projection. In some embodiments, the flush cable-tie down points 6 may be polygon shaped (e.g., a triangle, diamond, square, pentagon, hexagon, octagon). In some embodiments, the flush cable tie-down points 6 may be complex multi-functional shapes corresponding to specific projections or attachments. The flush cable tie-down points 6 may be used to mount components via hardware assembly (e.g., screws, bolts, rivets). In some embodiments, the cable management bracket 1 may be mounted onto other hardware (e.g., a rail, a bracket, or a panel) of the rack through the flush cable tie-down points 6. In some embodiments, cable management solutions, such as cable splitters, may be mounted onto the cable management bracket 1.

Protruding cable tie-down points 8 may be configured to receive and retain projections and attachments in order to properly manage cables within the rack. The size and shape of the protruding cable tie-down points 8 may be altered depending on the selected projection or attachment. For example, protruding cable tie-down points may be well-suited for tie-attachments (e.g., zip-ties and straps), as tie attachments conveniently loop within the open area inside the protrusion. However, the protruding cable tie-down points 8 may be configured to accommodate any projection or attachment. Any suitable tie-attachment may be used, including VELCRO® Straps (Velcro Industries B.V. LIMITED LIABILITY COMPANY NETHERLANDS Castorweg 22-24 Curacao NETHERLANDS), zip-ties, hooks, loops, and rings. In some embodiments, the open area within the protrusion may be relatively small, allowing straps and rings to be securely attached onto the cable management bracket 1. In some embodiments, the open area within the protrusion may be relatively large, allowing larger tie-attachments, such as ropes or bungee cords, to be securely attached onto the cable management bracket 1. In some embodiments, the open area with the cable tie-down points 8 may be large enough to allow the cables themselves to be routed through the cable tie-down points 8 without the need of a separate attachment (e.g., without using zip-ties).

The orientation of the cable tie-down points may be situationally selected. For example, the protruding cable tie-downs 8 may face inward or outward relative to the surface of the bracket, depending on the cabling solution. Further, the cable tie-down points may be orientated vertically, horizontally, or diagonally.

Any suitable number or arrangement of cable tie-down points may be disposed on the cable bracket body 5. For example, in some embodiments, the cable bracket body 5 may include solely protruding cable tie-down points 8. Conversely, in some embodiments, the cable bracket body 5 may include solely flush cable tie-down points 6. As depicted in FIG. 1, both types of cable tie-down points (e.g., flush or protruding) may be included on the cable bracket body 5. Further, as depicted in FIG. 1, cable tie-down points may only be included on the first planar surface 2. However, in some embodiments, cable tie-down points may be included on either surface (the first planar surface 2 or the second planar surface 3) or both surfaces. Any suitable number or arrangement of cable-tie down points may be administered depending on the rack requirements. It is to be understood that the size, shape, arrangement, and number of the flush and protruding cable tie-down points 6, 8 as shown in FIG. 1 is exemplary, and that any size, shape, arrangement, or number otherwise consistent with this disclosure is contemplated.

The cable management bracket 1, and components thereof, may be manufactured with any suitable manufacturing method. The cable bracket body 5 may be manufactured using any suitable material, including metals, polymers, wood, glass, composites, and ceramics. In some embodiments, the cable bracket body 5 is manufactured from sheet metal for durability. This allows the cable bracket body 5 to endure shipping environments. Further, fabricating sheet metal (e.g., bending, cutting, punching) is relatively easy compared to other materials, such as glass, ceramics, and polymers. The bend line 24 and other bends (e.g., attachment clamp 4 bends, protruding tab 18) may be formed with any suitable method, including vise or machine bending.

Cable tie-down points, guide tabs, and other cutouts (e.g., rivet holes) may be formed with any suitable manufacturing method, including punching, stamping, CNC machining, cutting, or pressing into the cable management bracket 1. In some embodiments, flush cable tie-down points 6 are formed via stamping or punching. In some embodiments, protruding cable tie-down points 8 are formed by cutting and pressing into the metal. In some embodiments, guide tabs are formed by making cuts and bending the guide tabs perpendicular to the surface they are placed on.

In some embodiments, the cable management bracket 1 may be additively manufactured (e.g., 3D printed). In these embodiments, the bracket geometry may be input into a computer, and the computer may cause an additive manufacturing machine to produce the cable management bracket 1. This may allow the cable management bracket 1 to be manufactured in unison, with no attached components. Further, the cable management bracket 1 may be manufactured in a single process, as opposed to the multiple processes (e.g., bending, cutting, milling) required for traditional manufacturing. Likewise, the cable bracket body 5 and attachment clamp 4 may be additively manufactured separately, and attached thereafter.

The aforementioned manufacturing methods may be completed by a computer (e.g., by a processor connected to a memory device that includes computer code to cause the process to perform the aforementioned operations). Likewise, the computer may cause another machine to complete the aforementioned manufacturing methods. In some embodiments, a user defines the dimension of the cable management bracket 1 based on the cabling, servicing, and rack requirements and inputs the dimensions into a computer. The computer may then cause a machine to make the desired cable management bracket 1. In some embodiments, a user may select the type of rack and server cabling requirements, and configure a computer to determine the cable management bracket 1 dimensions based on the specific requirements. Various machines may be instructed to manufacture the cable management bracket 1, including hydraulic benders, CNC Mills, waterjet cutters, plasma cutters, laser cutters, flame cutters, 3D printers, hydraulic punching presses, and the like.

Figure 2:
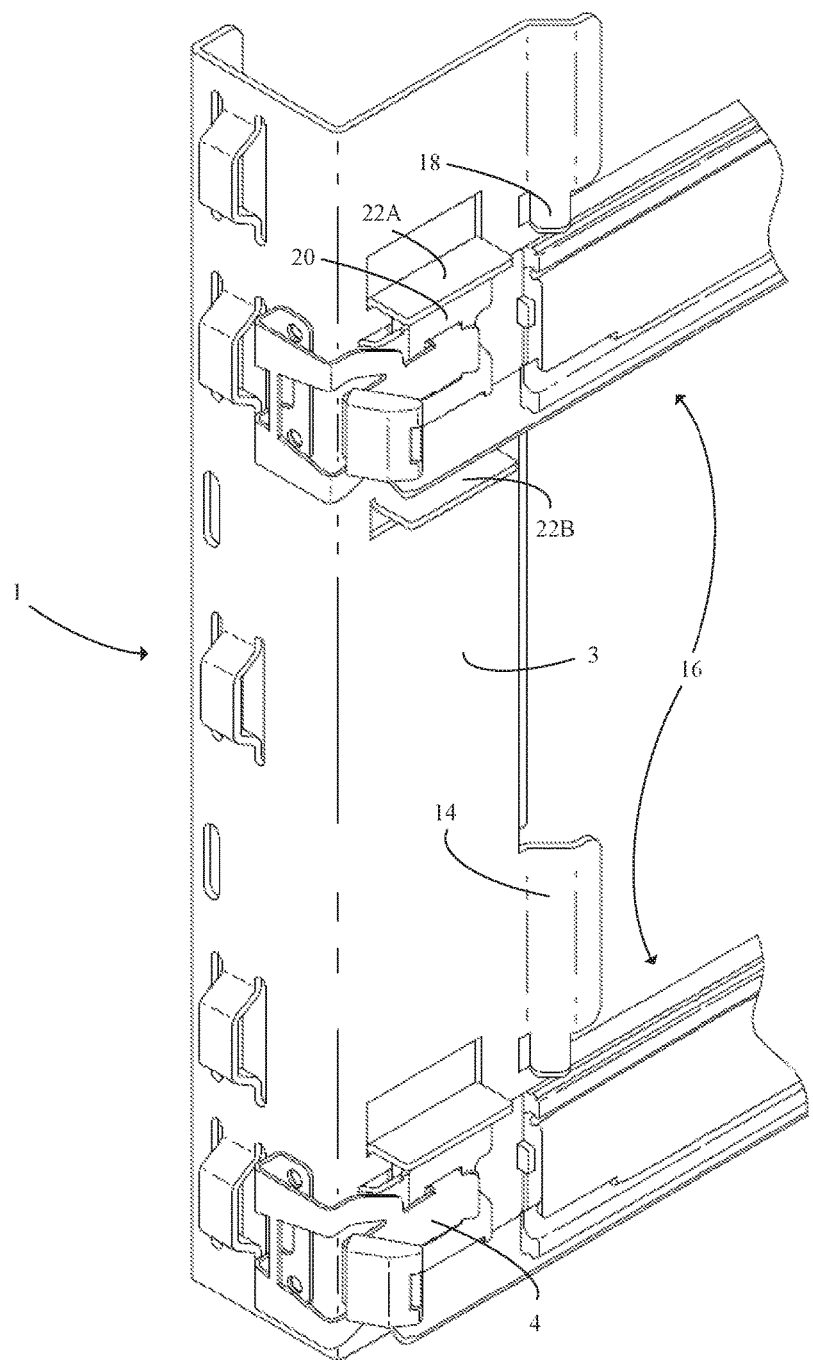
FIG. 2 illustrates the cable management bracket attachment clamps connected to mount points located on vertically aligned horizontal rails, in accordance with embodiments of the present disclosure.

FIG. 2 is an illustration of the cable management bracket 1 attached to the mount points 20 of the horizontal rails 16. The cable management bracket 1 may follow the dashed projection lines depicted in FIG. 1 to conjoin attachment clamps 4 with mount points 20 of the horizontal rails 16. As previously mentioned, the guide tabs may provide alignment between the attachment clamps 4 and the mount points 20. Prior to guide tab alignment, the contact protuberances 18 of the protruding tabs 14 may provide rough alignment between the guide tabs and the horizontal rail 16. After the guide tabs align the attachment clamp 4 with the mount points 20 of the horizontal rails 16, a pair of clamp teeth of the attachment clamp 4 may lock into mount slots located on the horizontal rail 16. The clamp teeth and mount slots may be substantially the same as clamp teeth 28 and mount slots 21 depicted in FIG. 4 and FIG. 1 respectively.

The protruding tab 14 and corresponding contact protuberance 18 may protrude out from the second planar surface 3. As depicted in FIG. 2, the contact protuberance 18 may be positioned above each attachment clamp 4, in line with the upper guide tabs 22A. The contact protuberance 18 may be the first component of the cable management bracket 1 to engage the horizontal rails 16. The contact protuberances 18 may provide rough alignment between the guide tabs and the horizontal rails 16.

The protruding tabs 14 and corresponding contact protuberances 18 may be any suitable size and shape. Further, the contact protuberances 18 may be placed in any suitable location. In some embodiments, the contact protuberances 18 may include a pointed end (e.g., triangular or needle shaped), to contact the horizontal rails 16 at a single point. In some embodiments, the protruding tabs 14 and corresponding contact protuberances 18 may be positioned in line with lower guide tabs 22B. In these embodiments, the contact protuberance may be facing upwards toward the horizontal rail 16, instead of downwards, as depicted in FIG. 2. In some embodiments, the cable management bracket 1 may include a pair of protruding tabs 14 (e.g., an upper and lower protruding tab) and respective contact protuberances 18. In these embodiments, the pair of contact protuberances 18 may each correspond to a pair of guide tabs. It is to be understood that the size, shape, arrangement, and number of the protruding tabs 14 and contact protuberances 18 as shown in FIG. 2 is exemplary, and that any size, shape, arrangement, or number otherwise consistent with this disclosure is contemplated.

The size and shape of the guide tabs may be configured to correspond to the horizontal rails 16. In some embodiments, the guide tabs may be spaced apart so they substantially match the height of the horizontal rails 16. This may allow the guide tabs to align the attachment clamp 4 with the mount points 20 located on the horizontal rail 16. In some embodiments, the upper and lower guide tabs 22A, 22B may be identical. In some embodiments, the upper and lower guide tabs 22A, 22B may be different, to match features attached to the horizontal rails 16. The attachment clamp 4 may be positioned between the pair of guide tabs depending on the mount point 20 location on the horizontal rail 16.

For example, as depicted in FIG. 1, if the mount points 20 are biased toward the top of the horizontal rail 16, the attachment clamp 4 may be biased toward the upper guide tab 22A. This may allow accurate alignment between the attachment clamp 4 and the mount points 20. In some embodiments, there may only be either an upper or lower guide tab 22A, 22B. In these embodiments, the time and cost of manufacturing may be reduced. For example, as depicted in FIG. 2, the lower attachment clamp 4 only includes an upper guide tab 22A. In some embodiments, the guide tabs may include a member that curves over the inside of each horizontal rail 16. In these embodiments, the guide tabs may lock the horizontal rails 16 into place in an additional dimension (e.g., left or right), so they may only be removed by pulling the cable management bracket 1 straight back away from each horizontal rail 16. It is to be understood that the size, shape, arrangement, and number of the guide tabs as shown in FIG. 2 is exemplary, and that any size, shape, arrangement, or number otherwise consistent with this disclosure is contemplated.

In some embodiments, the attachment clamp 4 may be configured to be repositionable along the cable bracket body 5. In these embodiments, the attachment clamp 4 may be manufactured with repositionable elements (e.g., slides, guide rails, magnetic attachments) which configure the attachment clamp to be moved along the cable bracket body 5. This may configure the attachment clamp 4 to be situationally adaptable. For example, if vertically orientated horizontal rails are separated by a rack distance of 4U, and the attachment clamps 4 are separated by a distance of 3U, the attachment clamps 4 may be movable along the cable bracket body 5 to align the attachment clamps 4 with the mount points 20 on horizontal rails 16 (e.g., move the attachment clamps 4 an additional 1U distance apart from each other so they may correspond to the 4U distance in which mount points 20 are separated).

FIG. 3 is a zoomed-in view of the attachment clamp 4 of the cable management bracket 1, in accordance with embodiments of the present disclosure. The mount plate, mount points, and mount slots of the horizontal rails (not shown in FIG. 3) may be substantially the same as the mount plate 19, mount points 20, and mount slots 21 of the horizontal rails 16 depicted in FIG. 1. The attachment clamp 4 mechanism may function (e.g., attach the cable management bracket 1 onto the horizontal rail) by sandwiching the mount points of the horizontal rail between the attachment clamp 4 and a back plate 26 of the cable management bracket 1 using a spring back force. The guide tabs may align clamp teeth 28 of the attachment clamp 4 with mount slots on the mount plates of the horizontal rail. The clamp teeth 28 of the attachment clamp 4 may then lock into corresponding mount slots.

The attachment clamp 4 may be retracted by pulling on a retraction pull tab 32, which generates a spring back force. The spring back force occurs as a result of the attachment clamp 4 material (e.g., sheet metal, plastic, and composites) biased toward its original shape prior to bending. The retraction pull tab 32 may be configured so a user may conveniently grip the end of the attachment clamp 4 to retract the clamp teeth 28 out of slots on the back plate 26. The mount points of the horizontal rail may then slide into the open space between the back plate 26 and attachment clamp 4. After the mount slots of the horizontal rail are aligned with the clamp teeth 26, the user may release the retraction pull tab 32, locking the clamp teeth 28 into the mount slots.

The retraction pull tab 32 may be any suitable size, shape, or material. In some embodiments, the retraction pull tab 32 is configured to allow a user to easily grip the attachment clamp 4. In some embodiments, the retraction pull tab 32 is manufactured from rubber, and slips over an end portion of the attachment clamp 4. Further, in some embodiments, the retraction pull tab 4 may be shaped to fit the shape of a finger. In some embodiments, the retraction pull tab 32 may be manufactured in unison with the attachment clamp 4. It is to be understood that the size and shape of the retraction pull tab 4 as shown in FIG. 3 is exemplary, and that any size or shape otherwise consistent with this disclosure is contemplated.

The attachment clamps 4 may be placed anywhere on the cable bracket body 5, so that proper alignment/mounting occurs between mount slots on the horizontal rail and the attachment clamps 4. In some embodiments, the attachment clamps 4 may be attached to the first planar surface 2 of the cable bracket body 5. However, the attachment clamp 4 may be disposed any other surface on the cable bracket body 5. The attachment clamp 4 may be attached to the cable bracket body 5 via welding, hardware assembly, riveting, brazing, soldering, gluing, or any other means of fastening the attachment clamp 4 onto the cable bracket body 5. In the embodiment depicted in FIG. 3, a contact surface 40 of the attachment clamp 4 contains a pair of rivet holes 42, which extend through the cable management bracket 1 (e.g., align with corresponding rivet holes in the cable bracket body 5). This may configure the attachment clamp 4 to be securely fastened onto the cable bracket body 5. Further, in some embodiments the attachment clamp 4 may be fully integrated with the cable bracket body 5, in that they are manufactured in unison. Manufacturing the cable bracket body 5 and attachment clamp 4 in unison (e.g., as a single, continuous piece) may reduce the amount of time required for manufacturing.

In some embodiments, the attachment clamps 4 may be replaceable or interchangeable. In some embodiments, the attachment clamps 4 may be attached to the cable bracket body 5 via a temporary attachment mechanism (e.g., hardware assembly or lock-and-key attachment as opposed to welding or riveting). This may configure the attachment clamps 4 to be conveniently removed from the cable bracket body 5. In these embodiments, if the attachment clamps 4 wear down (e.g., permanent deformation from metal fatigue), they may be replaced with new attachment clamps 4. In some embodiments, the attachment clamps 4 may be interchangeable with different variations of attachment clamps 4, to allow the cable management bracket 1 to attach onto varying mount points. For example, if the mount points on vertically aligned horizontal rails have a single slot instead of two slots, the attachment clamps 4 may be interchangeable with new attachment clamps having a single tooth.

Multiple bends may be implemented on the attachment clamp 4. As depicted in the embodiment on FIG. 3, a first bend 34, a second bend 36, and a third bend 38 (herein collectively referred to as multiple bends) may be implemented on the attachment clamp 4. The multiple bends may configure the attachment clamp 4 to span from the first planar surface 2 to the second planar surface 3. In some embodiments, the second planar surface 3 may be populated with the attachment clamp 4 features. Accordingly, in these embodiments, placing the contact surface 40 of the attachment clamp 4 on the first planar surface 2 may reduce the amount of congested space on the first planar surface 2. Further, spanning from the first planar surface 2 to the second planar surface 3 with multiple bends generates a spring back force over a longer distance, which may allow for fine-tuning an appropriate spring back force (e.g., so the spring back force is not too tight or too loose).

Figure 4:
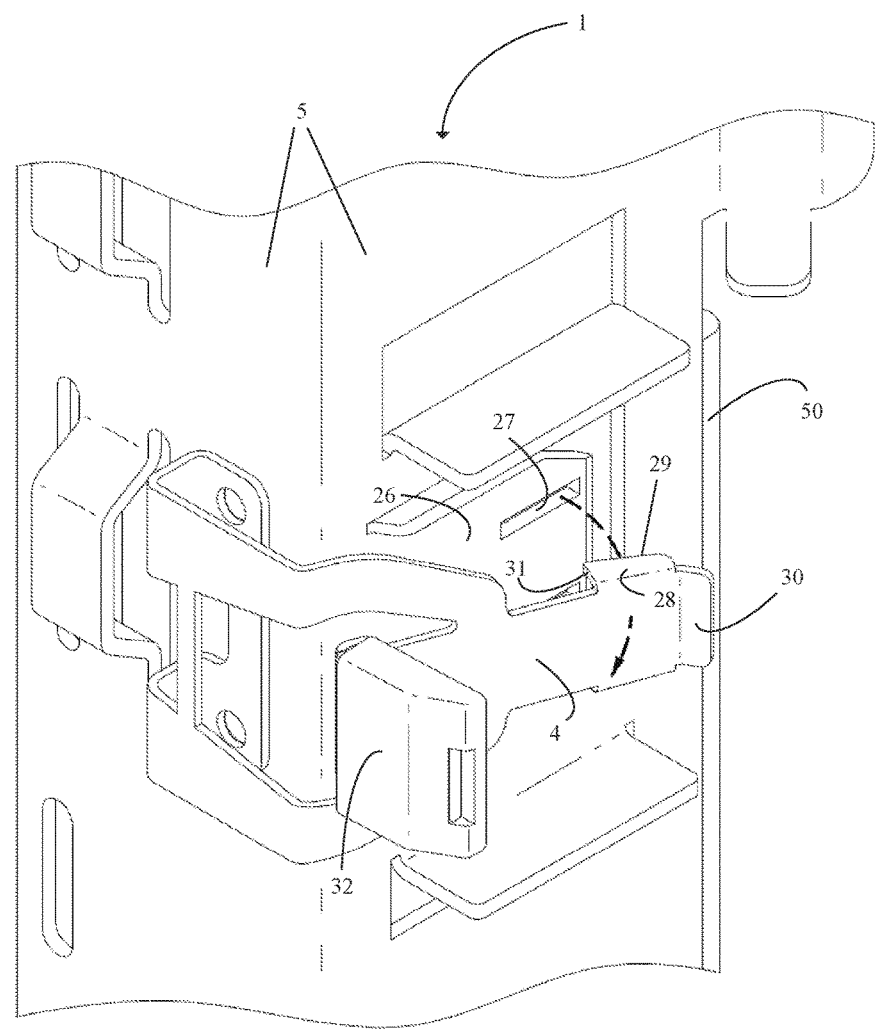
FIG. 4 depicts a zoomed-in view of the attachment clamp in the open state, in accordance with embodiments of the present disclosure.

FIG. 4 depicts a view of the attachment clamp 4 of the cable management bracket 1 in the open state, in accordance with embodiments of the present disclosure. The mount plate, mount points, and mount slots of the horizontal rails (not shown in FIG. 4) may be substantially the same as the mount plate 19, mount points 20, and mount slots 21 of the horizontal rails 16 depicted in FIG. 1. As previously mentioned, the attachment clamp 4 may be retracted by pulling (e.g., in a direction away from the clamp teeth 28) on the retraction member 32. In some embodiments, the attachment clamp 4 may be manufactured from an elastic material which generates a spring back force sufficient to squeeze the mount plate of the horizontal rail between the back plate 26 and the clamp teeth 28. In some embodiments, the attachment clamp 4 may be manufactured from a plastic (e.g., as opposed to elastic) material, which initially undergoes a reversible elastic deformation, resulting in a high spring back force. However, any suitable plastic/elastic material may be selected, including metals, plastics, and composites. In some embodiments, a ductile metal resilient to metal fatigue may be selected, so the attachment clamp 4 may retain its original shape after repeated elastic deformation cycles.

In some embodiments the attachment clamp 4 may be designed to easily insert into mount points on the horizontal rail, while securely maintaining the locking mechanism. In some embodiments, the attachment clamp 4 may include an upward curved edge 30. The upward curved edge 30 may prevent the attachment clamp 4 from intersecting with the mount plate of the horizontal rail. Clamp teeth 28 may include an incline edge 29, which may slant away from the mount plate of the horizontal rail. The inclined edge 29 of the clamp teeth 28, along with the upward curved edge 30, may allow the attachment clamp 4 to easily slide into mount slots on the mount plate. The mount plate may slide up and down the inclined edge 29, thereby configuring the clamp teeth to lock into the mount slots without retracting the attachment clamp 4. The clamp teeth 28 may also include a straight edge 31, which locks the clamp teeth 28 into the mount slots when pulling the cable management bracket 1 in a direction away from the horizontal rail.

The back plate 26 may include a pair of back plate slots 27, which correspond to the clamp teeth 28. This may allow the clamp teeth 28 to lock into the back plate 26 while the cable management bracket 1 is not attached to mount points. This feature may reduce stress on the clamp teeth 28 when the attachment clamp 4 is not in use. Further, the back plate slots 27 may provide additional fastening support between the attachment clamp 4 and the mount points. The clamp teeth 28 may extend through the mount slots located on the mount points and lock into the back plate slots 27 on the back plate 26.

Though a clamp feature is depicted in FIG. 4, any other suitable attachment mechanism may be implemented. Other potential attachment mechanisms include hardware assembly, retractable locking mechanisms, ties, lock and key mechanisms, adhesives, and the like. In some embodiments, there may be two mount plates surrounding the attachment clamp 4 when attaching the cable management bracket 1 onto the rack. In these embodiments, the attachment clamp 4 may include two pairs of clamp teeth on opposite ends of the attachment clamp 4, to accommodate both pairs of mount slots. Further, the two pairs of clamp teeth may be retractable, extending out of the attachment clamp 4 in response to an event (e.g., such as the activation a button, lever, or switch).

The cable management bracket 1 may further include a second planar layer fold 50. The second planar layer fold 50 may be formed by bending material of the second planar layer 3 toward the inside of the cable bracket body 5. The second planar layer fold 50 may reduce the amount of pressure exerted on cabling, by smoothing the cable bracket body 5 edges. The second planar layer fold 50 may be sized and shaped depending on the cabling requirements. In some embodiments, the second planar layer fold 50 may include slots to separate and organize cabling.

Figure 5:
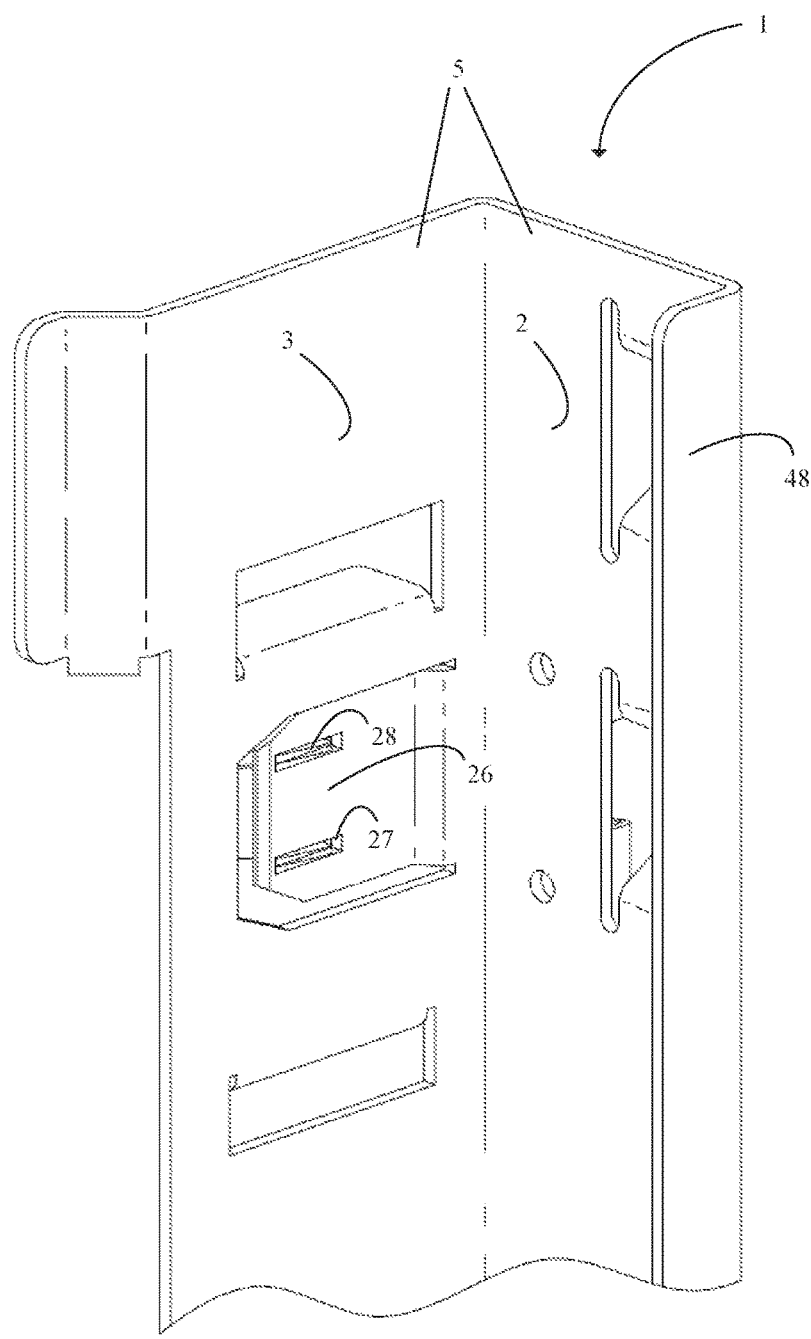
FIG. 5 depicts an inside view of the cable bracket body, in accordance with embodiments of the present disclosure.

FIG. 5 illustrates an inside view of the cable bracket body 5, in accordance with embodiments of the present disclosure. As previously mentioned, the clamp teeth 28 may slide into back plate slots 27 located on the back plate 26. The distance between the back plate slots 27 may be substantially the same as the distance between the clamp teeth 28, to allow the clamp teeth 28 to fit into the back plate slots 27. The back plate 26 may be adapted depending on the type of attachment mechanism used. For example, the size, shape, and number of back plate slots may correspond with the shape of the clamp teeth 28. In some embodiments, the attachment clamp includes a single circular tooth. In these embodiments, the back plate 26 would include a single circular shaped back plate slot 27. In some embodiments, the attachment clamp may include five attachment teeth. In these embodiments, the back plate 26 may include five back plate slots. Any suitable size, shape, number, or arrangement of back plate slots 27 may be administered. It is to be understood that the size, shape, arrangement, and number of back plate slots 27 as shown in FIG. 4 is exemplary, and that any size, shape, arrangement, or number otherwise consistent with this disclosure is contemplated.

The cable management bracket 1 may further include a first planar layer fold 48. The first planar layer fold 48 may be formed by bending material of the first planar layer 2 toward the inside of the cable bracket body 5. The first planar layer fold 48 may reduce the amount of pressure exerted on cabling, by smoothing the cable bracket body 5 edges. The first planar layer fold 48 may be sized and shaped depending on the cabling requirements. In some embodiments, the first planar layer fold 48 may include slots to separate and organize cabling.

Figure 6:
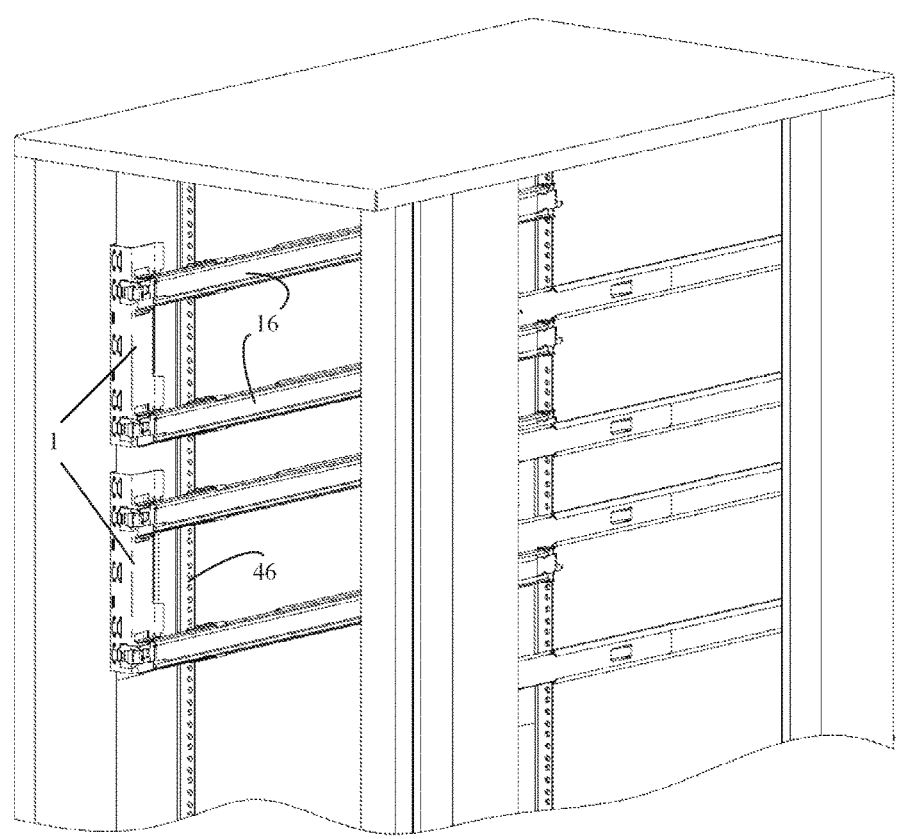
FIG. 6 depicts multiple cable management brackets attached to horizontal rails of a rack, in accordance with embodiments of the present disclosure.

FIG. 6 depicts two cable management brackets 1 mounted on horizontal rails 16 of a rack, in accordance with embodiments of the present disclosure. Depending on cabling requirements, one or more cable management brackets 1 may be mounted onto horizontal rail 16 mount points. For example, in an embodiment with a POD comprising four 2U height servers (total 8U height), a single cable management bracket 1 may sufficiently manage cabling requirements. However, in server rack configurations with two or more POD's, two or more cable management brackets 1 may be implemented.

Further, cable management brackets 1 may be placed in any suitable location. The cable management brackets 1 may be placed on either side of the server rack (e.g., left or right), or on both sides. This may depend on the location of serviceable components within the servers or the cabling requirements. Though the cable management brackets 1 are designed to attach onto mount points of horizontal rails 16, the cable management bracket 1 may also be attached to other hardware (e.g., a side panel, bracket, or rail) on the rack. For example, in some embodiments, the cable management bracket 1 may be bolted onto the vertical rails 46 via the flush cable tie-down points in addition to, or instead of, connecting to the horizontal rails 16.

Alternatively, a single cable management bracket 1 may span more two or more pairs of horizontal rails 16. In some embodiments, the cable management bracket 1 may be significantly longer, in that it spans half or more of the total rack height. In these embodiments, the number of attachment clamps may be commensurate with the number of corresponding horizontal rails 16. Further, in these embodiments, the cable management bracket 1 may be able to serve any number of servers (e.g., two or more PODs or a collection of dispersed servers). In some embodiments, the cable management bracket 1 may be extendable. In these embodiments, the height of the cable management bracket 1 may be adjusted to fit the cabling requirements, while avoiding unintended space within the rack. In these embodiments, there may be two attachment clamps on the total cable management bracket 1 height, while the extendable length comprises a plurality of flush and protruding cable tie-down points. Any type, number, size, or shape of cable management bracket 1 configurations may be implemented, depending on cabling, service, and rack volume considerations.

Figure 7:
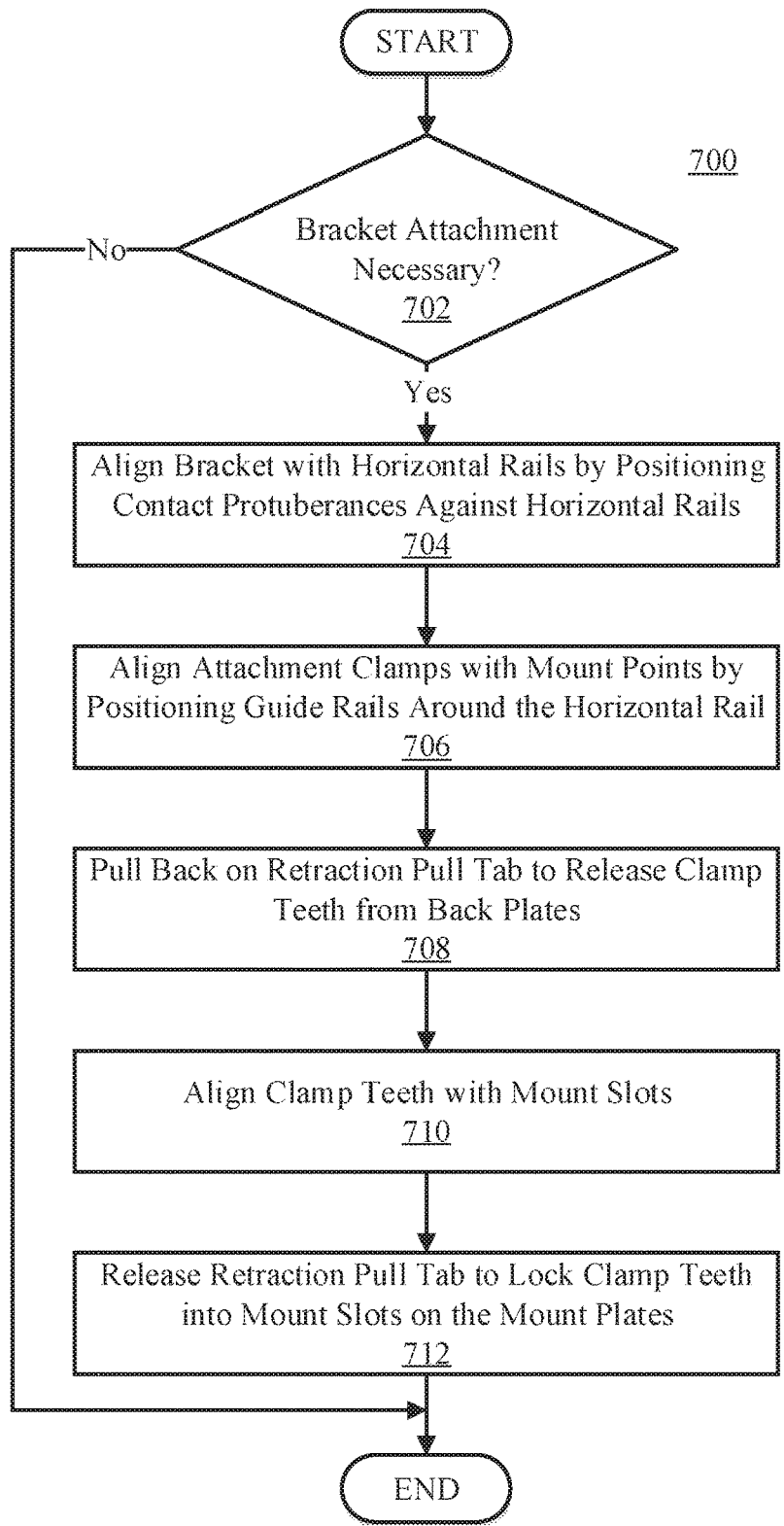
FIG. 7 depicts a flowchart of an example method for attaching a cable management bracket onto mount points of horizontal rails, in accordance with embodiments of the present disclosure.

FIG. 7 illustrates a flowchart of an example method 700 for attaching a cable management bracket onto horizontal rails, in accordance with embodiments of the present disclosure. The cable management bracket, horizontal rails, contact protuberances, mount points, attachment clamp, retraction pull tab, clamp teeth, and back plate may be substantially the same as the cable management bracket 1, horizontal rails 16, contact protuberances 18, mount points 20, attachment clamps 4, retraction pull tab 32, clamp teeth 28, and back plate 26 previously described. At operation 702, a user may determine whether a cable management bracket should be attached to a rack. The user may analyze the cabling, servicing, and rack requirements to determine whether the cable management bracket is necessary. Further at operation 702, a user may determine whether the cable management bracket is compatible with horizontal rails of the rack.

If the cable management bracket is necessary, at operation 704, the user may align contact protuberances against horizontal rails to roughly align the guide tabs with the horizontal rails. At operation 706, the user may align the attachment clamp with mount points located on the horizontal rails. At operation 708, the user may pull back on the retraction pull tab to retract the clamp teeth from the back plate on the cable management bracket. Afterwards, at operation 710, the user may align the clamp teeth with the mount slots located on the mount plates. When the clamp teeth are aligned with the mount slots, at operation 712, the user may release the retraction pull tab to lock the clamp teeth into mount slots on the mount plate.

The aforementioned operations may be completed in any order, or simultaneously. Furthermore, the aforementioned operations may be optional. For example, in some embodiments, pulling back on the retraction member to release the clamp teeth from the back plate may not be completed, as if the clamp teeth are inclined, the clamp teeth may slide into the mount slots without requiring retraction. In some embodiments, the retraction pull tab is retracted prior to aligning the mount points with the attachment clamp via the guide rails. Any suitable number or order of the aforementioned operations may be completed.

Figure 8:
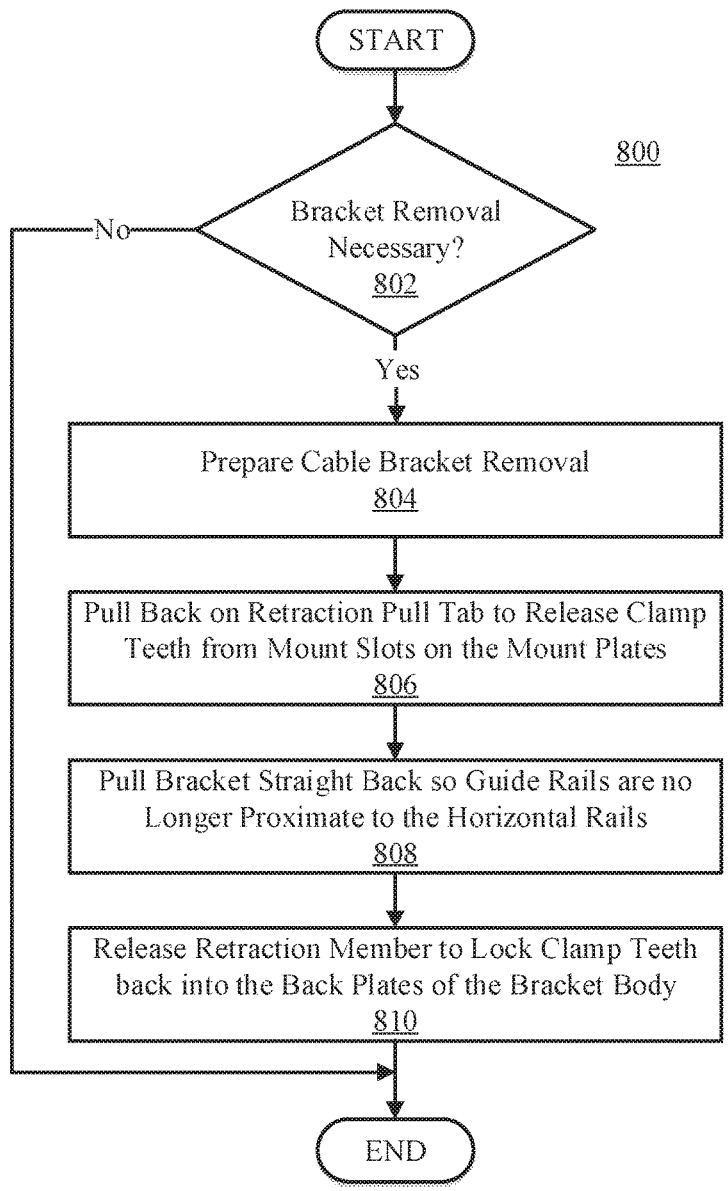
FIG. 8 depicts a flowchart of an example method for detaching a cable management bracket from mount points of horizontal rails, in accordance with embodiments of the present disclosure.

FIG. 8 illustrates a flowchart of an example method 800 for removing a cable management bracket, in accordance with embodiments of the present disclosure. The cable management bracket, horizontal rails, contact protuberances, mount points, attachment clamp, retraction pull tab, clamp teeth, and back plate may be substantially the same as the cable management bracket 1, horizontal rails 16, contact protuberances 18, mount points 20, attachment clamps 4, retraction pull tab 32, clamp teeth 28, back plate slots 27, and back plate 26 previously described. The cable management bracket may be attached according to example method 700 for attaching a cable management bracket onto a rack.

At operation 802, a user may determine whether cable management bracket removal is necessary. Bracket removal may be necessary to allow a technician to service components in the back of the servers. Further, bracket removal may be necessary when administering changes to the current rack configuration. However, bracket removal may be necessary in various other situations (e.g., upgrading rack components).

If a user determines bracket removal is necessary, at operation 804, the user may prepare cable management bracket removal. Cable management bracket removal preparation may include unplugging cabling from servers. In some embodiments, a user may want to leave cabling connected to the servers (e.g., if the cables do not need to be removed or for testing purposes), and cable management bracket removal preparation may include removing tie-attachments and projections from the cable management bracket.

At operation 806, a user may pull back on the retraction pull tab to release clamp teeth from corresponding mount slots on the mount plate. This may allow a user to pull the cable management bracket straight back away from the horizontal rails at operation 808, so guide tabs are no longer proximate to the horizontal rails. Lastly, at operation 810, the user may release the retraction pull tab to allow the clamp teeth of the attachment clamp to lock back into the back plate slots of the back plate on the cable management bracket.

The aforementioned operations may be completed in any order, or simultaneously. Furthermore, the aforementioned operations may be optional. For example, in some embodiments, cable management bracket removal preparation may not be necessary. In some embodiments, cable bracket removal preparation may be completed after removing the attachment clamp from mount points on the horizontal rail. In some embodiments, a user may not need to pull back on the retraction pull tab to remove the clamp teeth from the mount slots. In these embodiments, the clamp teeth may be angled so they may slide out of the mount slots with ease. Any suitable number or order of the aforementioned operations may be completed.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

Aspects of the present invention are described herein with reference to flowchart illustrations and/or block diagrams of methods, apparatus (systems), and computer program products according to embodiments of the invention.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A cable management bracket comprising:
 a first planar surface and a second planar surface connected by a bend line, wherein the first planar surface and the second planar surface form a cable bracket body;
 a plurality of cable tie-down points disposed on the cable bracket body; and
 two or more attachment clamps disposed on the cable bracket body, the two or more attachment clamps being configured to attach to two or more respective mount points located on vertically aligned horizontal rails, wherein the attachment clamps are separated by a distance equal to a separation distance of horizontal rail mount points, wherein the cable bracket body includes two or more pairs of guide tabs, wherein each of the two or more pairs of guide tabs corresponds to each of the two or more attachment clamps, wherein one guide tab of each of the two or more pairs of guide tabs is placed above each attachment clamp and wherein one guide tab of each of the two or more pairs of guide tabs is placed below each attachment clamp.

2. The cable management bracket of claim 1, wherein the plurality of cable tie-down points are disposed on the second planar surface.

3. The cable management bracket of claim 2, wherein the cable tie-down points include flush cable tie-down points and protruding cable tie-down points.

4. The cable management bracket of claim 1, wherein a distance between each guide tab of the pair of guide tabs is equal to a height of the horizontal rails.

5. The cable management bracket of claim 1, wherein the cable bracket body is configured to span an entire height of a rack.

6. The cable management bracket of claim 1, wherein each attachment clamp includes a pair of teeth, wherein each tooth includes a straight edge and an inclined edge.

7. The cable management bracket of claim 1, wherein the attachment clamp includes a retraction pull tab.

8. The cable management bracket of claim 1, wherein each attachment clamp includes retractable teeth.

9. The cable management bracket of claim 8, wherein each attachment clamp includes a back plate, the back plate including a pair of back plate slots which correspond to the pair of retractable teeth.

10. The cable management bracket of claim 9, wherein each attachment clamp is disposed on the first planar surface, wherein each attachment clamp includes a plurality of bends that span each attachment clamp from the first planar surface to the second planar surface, wherein the plurality of bends are configured to generate a spring back force.

* * * * *